(12) United States Patent
Kondou

(10) Patent No.: US 6,516,457 B1
(45) Date of Patent: Feb. 4, 2003

(54) METHOD AND SYSTEM OF DATA PROCESSING FOR DESIGNING A SEMICONDUCTOR DEVICE

(75) Inventor: Keiichirou Kondou, Kanagawa (JP)

(73) Assignee: NEC Corporation, Tokyo (JP)

(*) Notice: Subject to any disclaimer, the term of this patent is extended or adjusted under 35 U.S.C. 154(b) by 390 days.

(21) Appl. No.: 09/611,225

(22) Filed: Jul. 6, 2000

(30) Foreign Application Priority Data

Jul. 7, 1999 (JP) ............................................ 11-193236

(51) Int. Cl.[7] ............................ G06F 17/50; G06F 7/52; H01L 21/336; H01L 27/10
(52) U.S. Cl. ........................... 716/8; 716/11; 708/655; 438/287; 257/202
(58) Field of Search ............................................. 716/8

(56) References Cited

U.S. PATENT DOCUMENTS 4,872,214 A * 10/1989 Zurawski .................... 708/655
5,551,014 A * 8/1996 Yoshida et al. ............... 716/11
5,684,311 A * 11/1997 Shaw ........................ 257/202
6,348,385 B1 * 2/2002 Cha et al. ................... 438/287
2001/0045572 A1 * 11/2001 Shoji et al. ................. 257/202

FOREIGN PATENT DOCUMENTS

JP          5-243378 A        9/1993

* cited by examiner

Primary Examiner—Vuthe Siek
Assistant Examiner—Andrea Liu
(74) Attorney, Agent, or Firm—Sughrue Mion, PLLC

(57) ABSTRACT

A data processing system for designing a customized master slice data includes the steps of consecutively locating a cell base block based on the design data, a plurality of dummy gate blocks, and a possible number of intermediate blocks in the area of the semiconductor chip; replacing dummy gate blocks by gate array blocks while shifting the gate array blocks by half length; and locating intermediate blocks in an area generated by shifting the gate array blocks. The space between the gate array block and the cell base block is filled with the intermediate blocks for preventing interference therebetween.

11 Claims, 12 Drawing Sheets

METHOD AND SYSTEM OF DATA PROCESSING FOR DESIGNING A SEMICONDUCTOR DEVICE

BACKGROUND OF THE INVENTION (a) Field of the Invention

The present invention relates to a method and a system of data processing for designing a semiconductor device and, more particularly, to a technique for designing a semiconductor device by using CAD data and a combination of cell base blocks and gate array blocks.

(b) Description of the Related Art

Master slice technique is generally used for designing semiconductor devices such as an LSI. The master slice technique uses a semiconductor wafer called master slice, wherein a large number of basic circuit elements are arrayed in each chip without interconnections therebetween. A user can design a desired semiconductor device or customized master slice by designing specific interconnections in the master slice.

A data processing system is also known which assists the user in the circuit design for the master slice. The data processing system typically includes a computer system or CAD system wherein a control program for assisting the circuit design is installed for a computer. In this case, the master slice itself is prepared as a part of the CAD data to which other data such as for the desired interconnections are added by the user to obtain final CAD data.

In the up-to-date design technique using the master slice scheme, the simple arrangement of the basic circuit elements in the master slice as described above is replaced by a new complicated arrangement wherein a plurality of gate array blocks, a plurality of cell base blocks and a plurality of intermediate blocks are arranged based on the design data provided by the user.

The gate array block includes a plurality of transistors arranged without interconnections therebetween, to which the user adds desired interconnections to obtain desired logic circuits. On the other hand, the cell base block includes a plurality of circuit elements arranged with specific interconnections therebetween to form a logic gate or a logic circuit having a specific function. Each cell base block forms a specified-type logic circuit, and a plurality of cell base blocks having different types of logic circuits are prepared before the design of a specific semiconductor device.

The intermediate block is generally disposed at a boundary between a gate array block and a cell base block for preventing the interference therebetween.

These different types of blocks are arranged based on the design data for the desired semiconductor device while selecting the interconnections for the blocks, whereby CAD data for a customized master slice implementing the desired semiconductor device can be obtained without a complicated design process.

A process for preparing the CAD data for the customized master slice will be exemplified below.

First, data for a gate array block and a plurality of types of cell base blocks and an intermediate block are stored in a netlist, and data for the area of the chip or site are stored as an information file.

In general, the site on which blocks are to be arranged is separated into a pair of imaginary planes including a gate array plane and a cell base plane, on each of which a specific type of blocks can be arranged. By combining the pair of imaginary planes to obtain an overlapping plane at each step of the process, all the data for the site can be obtained on the overlapping plane.

Thus, the gate array plane and the cell base plane are defined for the single site in this process. The gate array plane can receive therein a gate array block, whereas the cell base plane can receive therein a cell base block and an intermediate block.

After the data as described above are prepared, the user inputs design data for a desired semiconductor device, whereby a specific cell base block or cell base blocks are disposed in a specified portion of the cell base plane based on the design data.

After the cell base blocks are disposed in the cell base plane, a plurality of gate array blocks are consecutively arranged on the gate array plane in an area other than the area wherein the cell base block is disposed as viewed on the overlapping plane. Then, intermediate blocks are consecutively disposed on the cell base plane in the areas other than the area wherein the cell base block or the gate array block is disposed as viewed on the overlapping plane. By overlapping the final gate array plane and the final cell base plane, desired master slice data can be obtained on the final overlapping plane.

In the process as described above, the cell base block is disposed in the area of the site based on the design data. That is, a plurality of logic circuits are arranged in the area desired by the user, with the other area not specified by the design data being filled with the gate array blocks without interconnections.

Then, data for interconnections are added to the gate array blocks to form logic circuits, and the data for the interconnections between the cell base blocks and the gate array blocks are added to connect the blocks together, thereby obtaining desired CAD data or customized master slice data for the semiconductor device.

In the gate array block including a plurality of transistors, the locations of the diffused regions for the well contact and the substrate contact are fixed sandwiching therebetween the transistors. In this configuration, a plurality of gate array blocks can be arranged adjacent to each other without interference therebetween. However, a plurality of cell base blocks forming different types of logic circuits have respective circuit arrangements which may interfere with the arrangement of an adjacent gate array block depending on the type of the logic circuit of the cell base block. The interference may arise between the diffused regions in the respective blocks. Thus, a manual examination is conducted as to whether or not the interference arises between a cell base block and an adjacent gate array block.

If the interference is found between a cell base block and an adjacent gate array block, the gate array block is replaced by an intermediate block.

In the above procedure, there is a problem in that the manual examination for the interference lowers the efficiency in the data processing in the CAD system. Although the examination and replacement of the block itself may be conducted by using a program for the CAD system, there arises the problem that the scale for the program increases and the large-scale program prolongs the processing time for the CAD system.

In an alternative, a functional area for preventing the interference may be provided in each cell base block or each gate array block. However, the functional area increases the occupied area for the block.

SUMMARY OF THE INVENTION

It is therefore an object of the present invention to provide a method and a system for designing a customized master slice for a semiconductor device by using a CAD data, which is capable of preventing the interference between adjacent blocks.

It is also an object of the present invention to provide a storage device for storing a program which is capable of allowing a CAD system to design a customized master slice for a semiconductor device while preventing the interference between adjacent blocks.

The present invention provides a data processing system for designing a semiconductor device based on design data, comprising:

a block data storage section for storing first data specifying a gate array block, the gate array block including a plurality of transistors disposed in a line symmetry, second data specifying a plurality of cell base blocks, each of the cell base blocks including a plurality of transistors, third data specifying an intermediate block having a unit length and fourth data specifying a dummy gate block, the dummy gate block having a configuration obtained by reversing the gate array block around a line for the line symmetry, the gate array block and the dummy gate block having a length equal to an integral multiple of the unit length, the cell base block having an integral multiple of the unit length;

a first block arrangement section for consecutively locating at least one cell base block in a first area based on the design data, a possible number of the dummy gate blocks in a second area, and a possible number of the intermediate blocks in an area other than the first and second areas;

a block removing section for removing the dummy gate blocks after the first block arrangement section arranges the intermediate blocks;

a second block arrangement section for locating a possible number of the gate array blocks in each space generated by removing the dummy gate blocks while shifting the gate array blocks by a specified amount from a corresponding one of the removed dummy gates;

a third block arrangement section locating a possible number of the intermediate blocks in an area generated by shifting the gate array blocks; and an output section for outputting a customized master slice data based on the operation by the first through third block arrangement sections.

The present invention also provides a method of data processing system for designing location of blocks in a semiconductor device based on design data, comprising the steps of:

storing first data specifying a gate array block, the gate array block including a plurality of transistors disposed in a line symmetry, second data specifying a plurality of cell base blocks, each of the cell base blocks including a plurality of transistors, third data specifying an intermediate block having a unit length and fourth data specifying a dummy gate block, the dummy gate block having a configuration obtained by reversing the gate array block around a line for the line symmetry, the gate array block and the dummy gate block having a length equal to an integral multiple of the unit length, the cell base block having an integral multiple of the unit length;

consecutively locating at least one cell base block in a first area based on the design data, a possible number of the dummy gate blocks in a second area, and a possible number of the intermediate blocks in an area other than the first and second areas;

removing the dummy gate blocks after the first block arranges the intermediate blocks;

locating a possible number of the gate array blocks in each space generated by removing the dummy gate blocks while shifting the gate array blocks by a specified amount from a corresponding one of the removed dummy gates;

locating a possible number of the intermediate blocks in an area generated by shifting the gate array blocks; and outputting a customized master slice data obtained by the above steps.

In accordance with the present invention, intermediate blocks disposed between the gate array block and the gate array bock prevent the interference from occurring at the boundary between the gate array block and the cell base block.

The above and other objects, features and advantages of the present invention will be more apparent from the following description, referring to the accompanying drawings.

PREFERRED EMBODIMENT OF THE INVENTION

Figure 1:
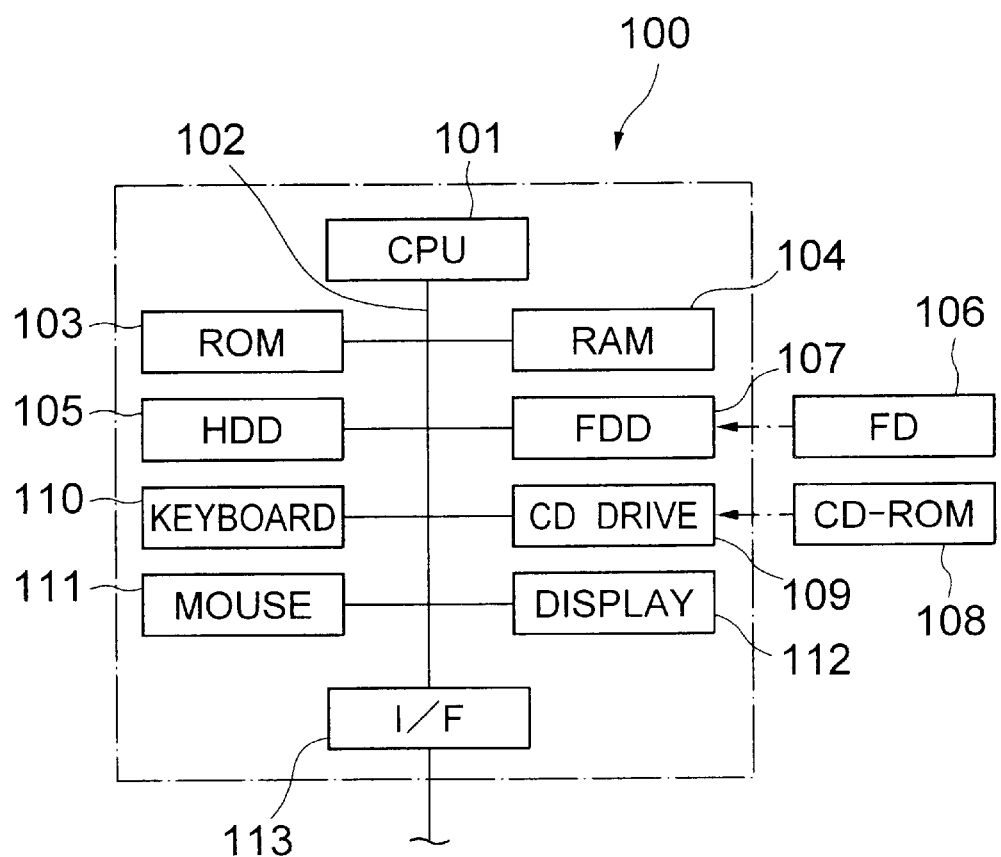
FIG. 1 is a physical block diagram of a data processing system according to an embodiment of the present invention.

Now, the present invention is more specifically described with reference to accompanying drawings, wherein similar constituent elements are designated by related reference numerals.

Referring to FIG. 1, a data processing system, generally designated by numeral 100, according to an embodiment of the present invention has a physical configuration wherein a CPU 101 is connected to peripheral devices including a ROM 103, RAM 104, a hard disk drive (HDD) 105, a floppy disk drive (FDD) 107 for driving a floppy disk 106, a CD drive 109 for driving a CD-ROM 108, a keyboard 110, a mouse 111, a display unit 112, and a communication interface 113 via a bus 102. The CPU 101 may be a personal computer or any other type of office computer.

A control program and a variety of data necessary for operating the data processing system 100 is stored in at least one of storage devices including ROM 103, RAM 104, HDD 105, FD 106 and CD-ROM 108.

For example, the control program for operating the CPU 101 in data processing is stored beforehand in the HDD 105, FD 106 and/or CD-ROM 108. The program stored in the HDD 105, for example, is copied upon start-up of the system to the RAM 104 and read therefrom by the CPU 101.

Figure 2:
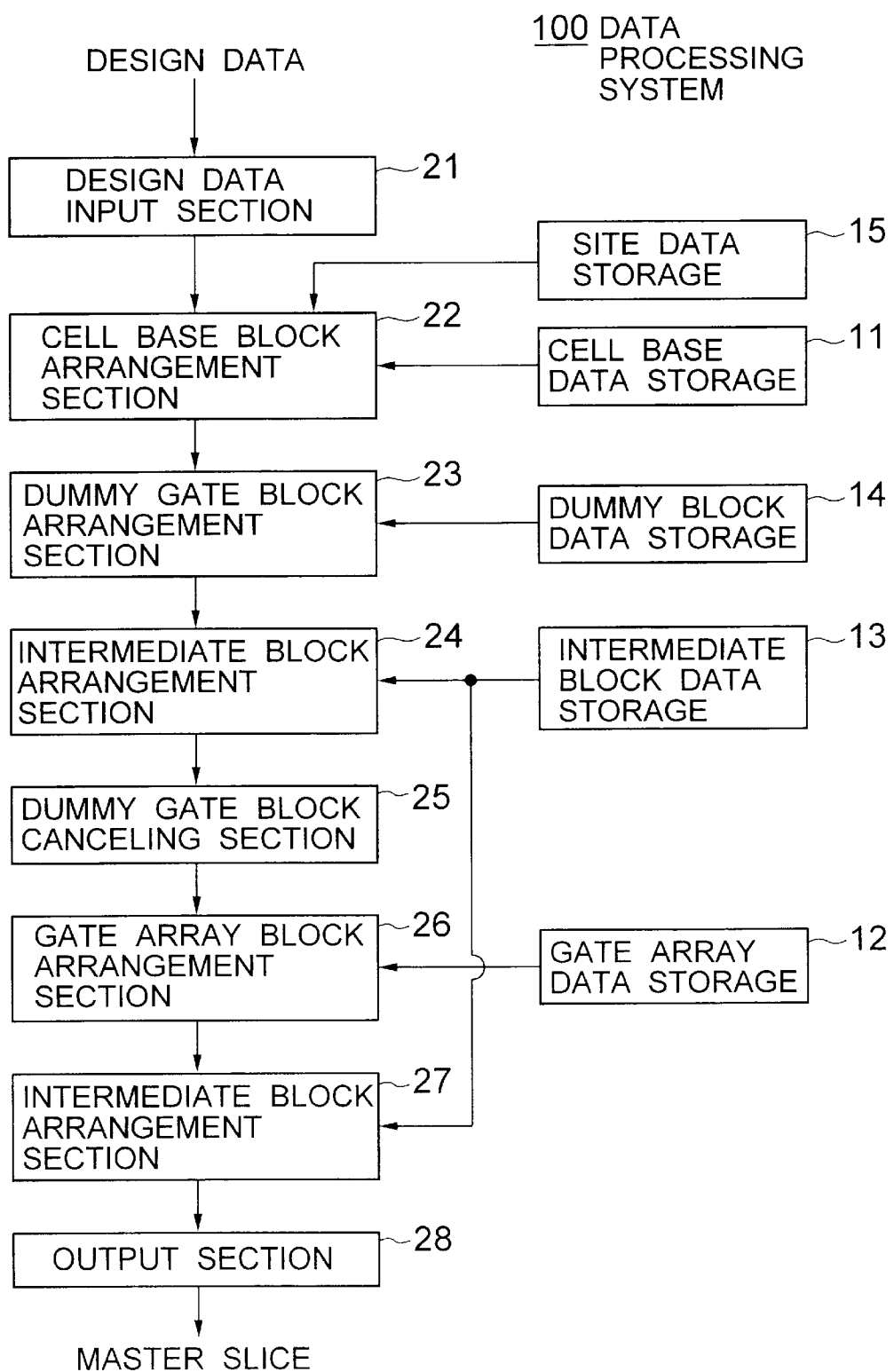
FIG. 2 is a logic block diagram of the data processing system of FIG. 1.

By running the CPU 101 on the control program, the data processing system 100 implements the functional means, such as shown in FIG. 2, including a cell base data storage section 11, a gate array data storage section 12, intermediate block data storage section 13, a dummy block data storage section 14, a site data storage section 15, a design data input section 21, a cell base block arrangement section 22, a dummy gate block arrangement section 23, an intermediate block arrangement section 24, a dummy gate block canceling section 25, a gate array block arrangement section 26, an intermediate block arrangement section 27, and a data output section 28 for outputting a data specifying a customized master slice.

Each of the storage sections 11 to 15 corresponds to a memory area formed in a HDD 105 etc. which the CPU 101 recognizes based on the control program stored in the RAM 104.

Figure 3:
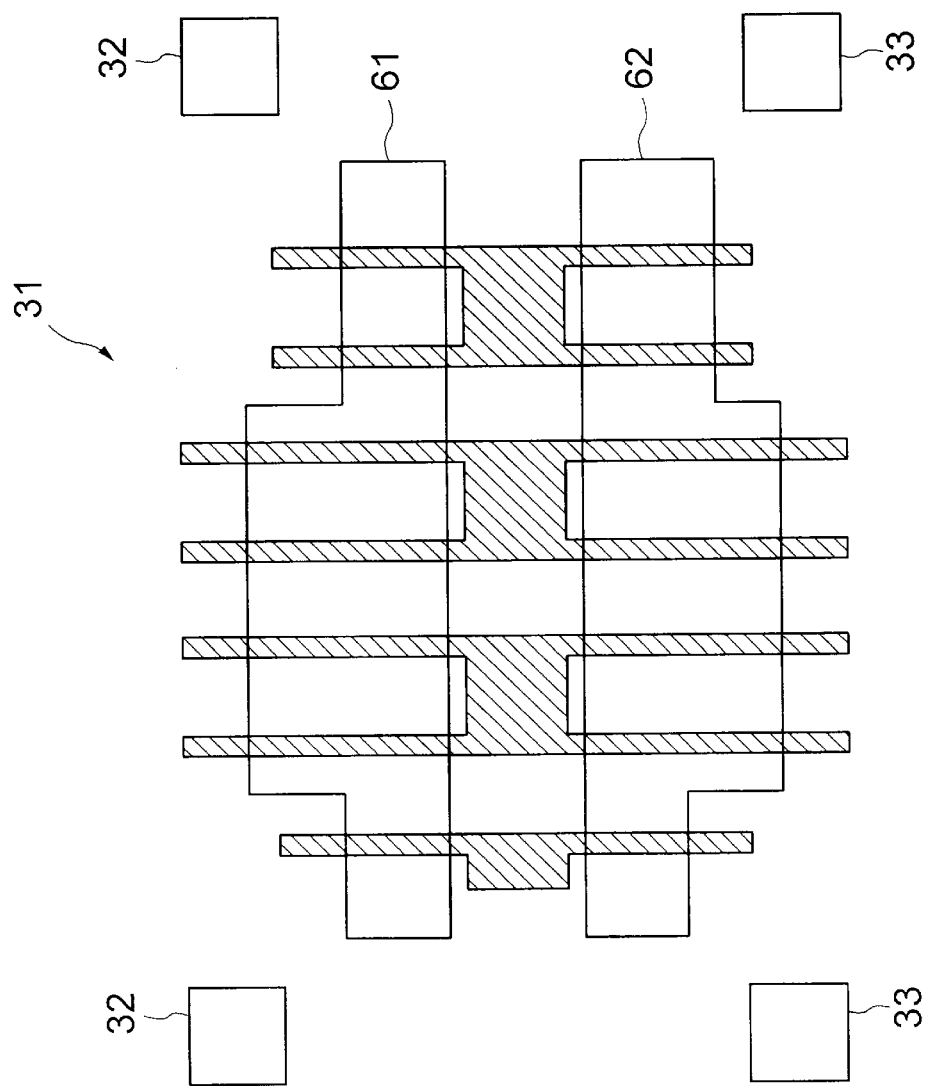
FIG. 3 is a schematic top plan view of one of typical cell base blocks.

The cell base data storage section 11 stores data for a plurality of cell base blocks having different configurations. Referring to FIG. 3, an exemplified cell base block 31 includes a plurality of circuit elements, such as transistors, which are connected to form a specified logic circuit or logic gate, such as NAND or NOR gate. Depending on the different types of the cell base blocks 31 having different functions and different arrangements, a pair of square diffused regions 32 and 33 used for a well contact and a substrate contact, respectively, may be disposed on each side of the cell base block 31, as exemplified in FIG. 3. The well contact 32 and the substrate contact 33 fix the potentials of the well and substrate, respectively. In FIG. 3, each of a pair of diffused regions 61 and 62 for receiving therein a set of transistors including seven CMOSFETs is shown by a blank polygon, whereas a gate electrode is shown by hatching.

Figure 4:
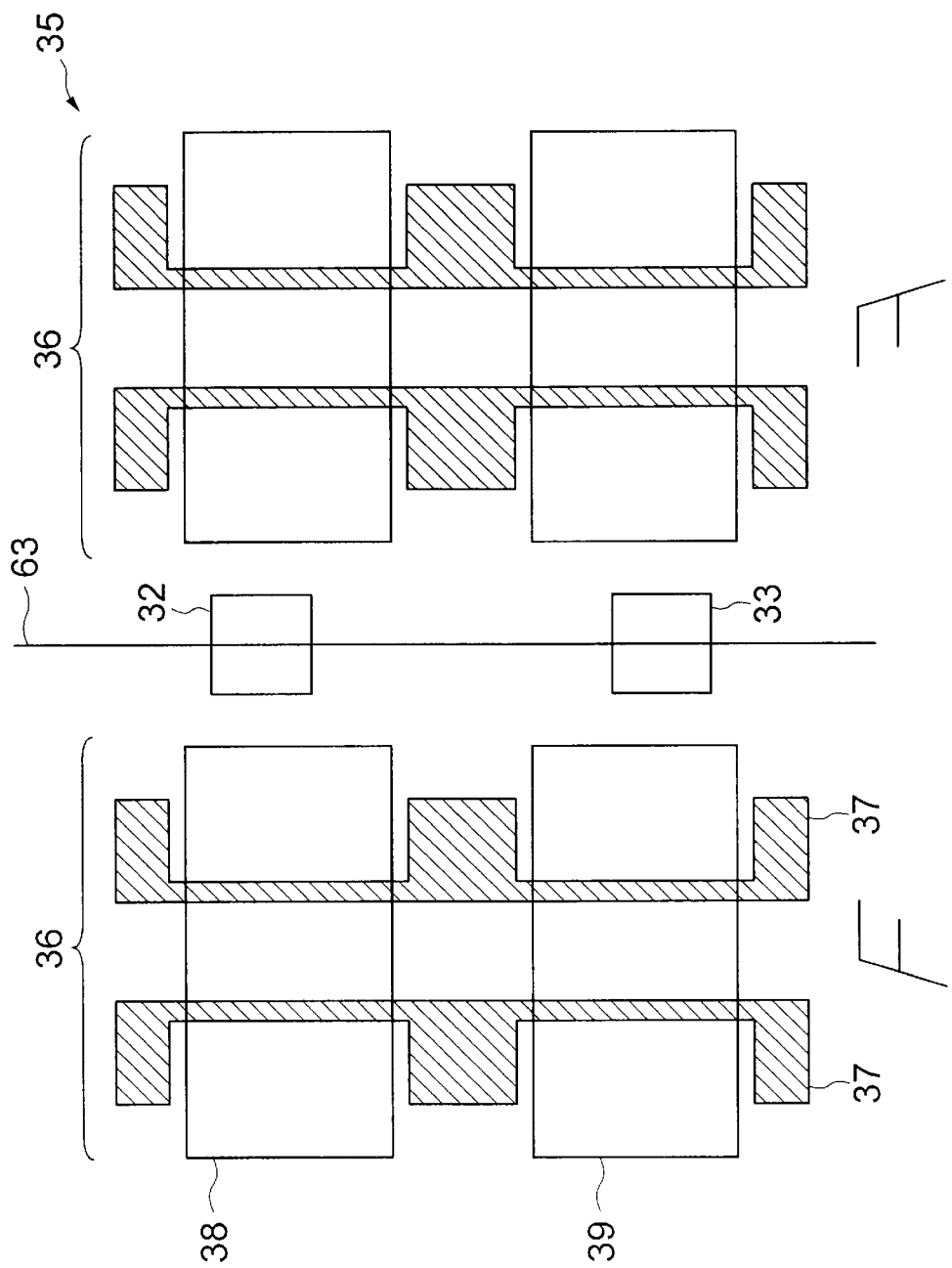
FIG. 4 is a schematic top plan view of a gate array block.

The gate array data storage section 12 stores data for a specific gate array block. Referring to FIG. 4, the gate array block 35 includes four CMOS transistors 36 arranged in a symmetry with respect to a central line 63 passing through the center of the central square diffused regions 32 and 33. Each CMOS transistor 36 includes a gate electrodes 37, a half of a p-type diffused region 38 and a half of an n-type diffused region 39, which form a p-channel transistor and an n-channel transistor arranged in the vertical direction as viewed in the figure. The central square diffused regions 32 and 33 are used for a well contact and a substrate contact, respectively.

Figure 5:
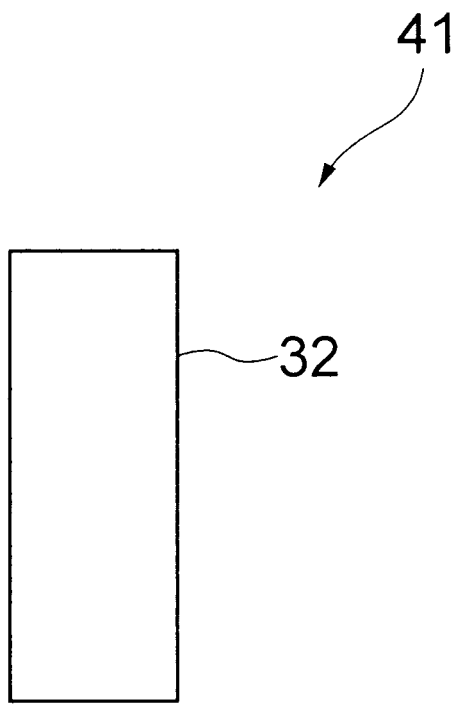
FIG. 5 is a schematic top plan view of an intermediate block.
Figure 5:
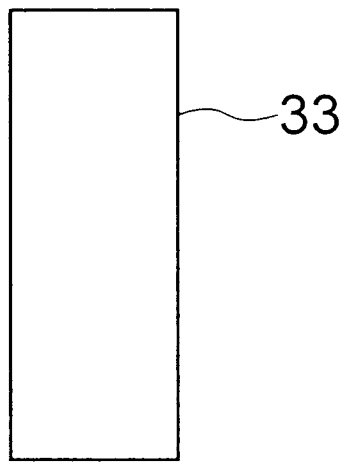

The intermediate block data storage section 13 stores data for an intermediate block. Referring to FIG. 5, the intermediate block 41 has a pair of rectangular diffused regions 32 and 33 used as a well contact and a substrate contact, respectively, and arranged in a vertical direction as viewed in the figure. The intermediate block has a unit length as viewed in the horizontal direction in the figure. The structure of the intermediate block 41 is suited for separation of the cell base block 31 from the gate array block 35 without an interference therebetween.

Figure 6:
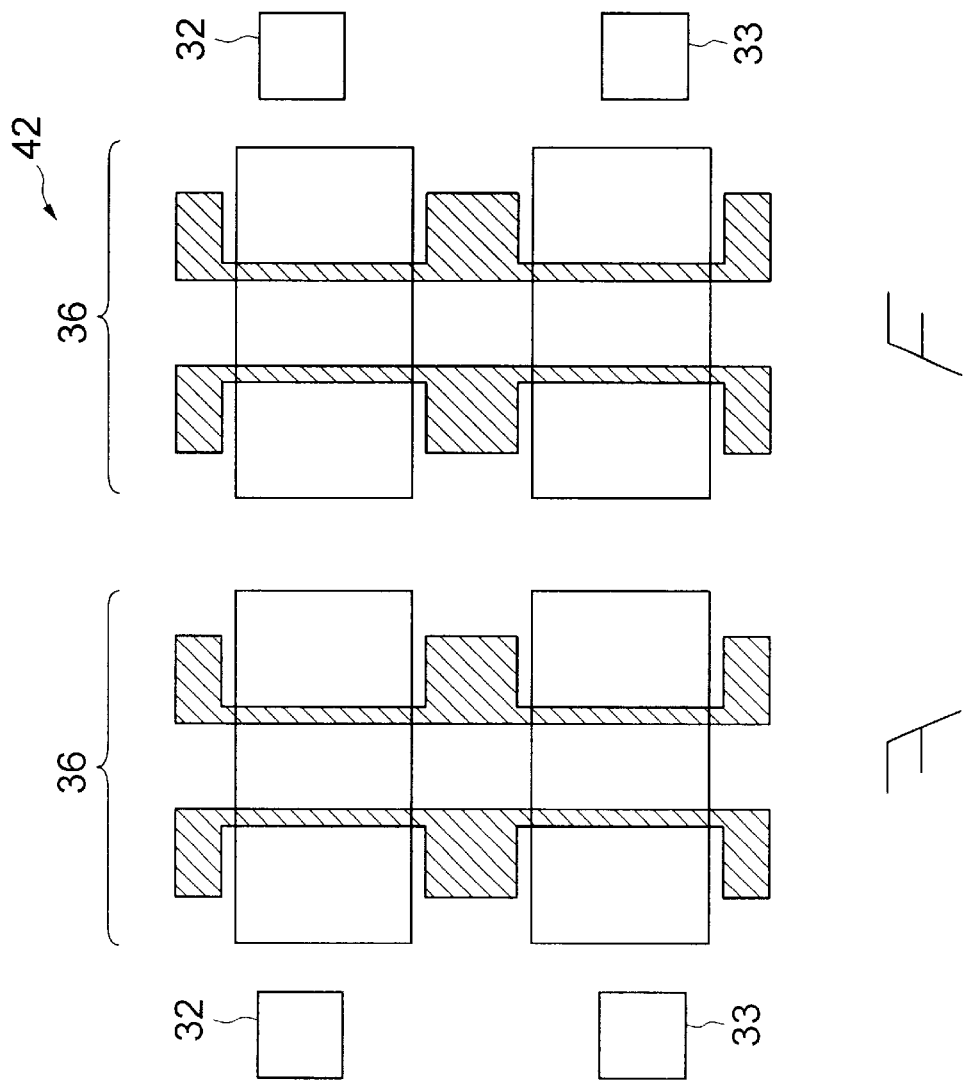
FIG. 6 is a schematic top plan view of a dummy gate block.

The dummy block data storage section 14 stores data for a dummy gate block. Referring to FIG. 6, the dummy gate block 42 has a length substantially equal to the length of the gate array block 35 as viewed in the horizontal direction in the figure. The dummy gate block has a configuration wherein the gate array block 35 shown in FIG. 4 is separated at the center into two sub-blocks and then arranged again with the two sub-blocks are exchanged therebetween except for the diffused regions 32 and 33, which are disposed in pair at each side of the dummy gate block 42.

Figure 7A:
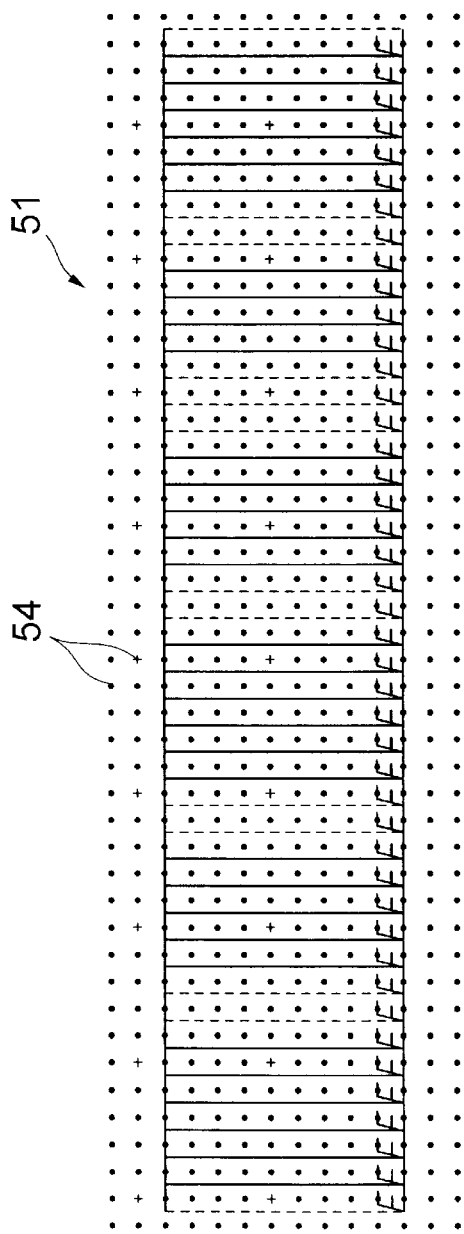
FIG. 7A is a schematic top plan view of a cell base plane.
Figure 7B:
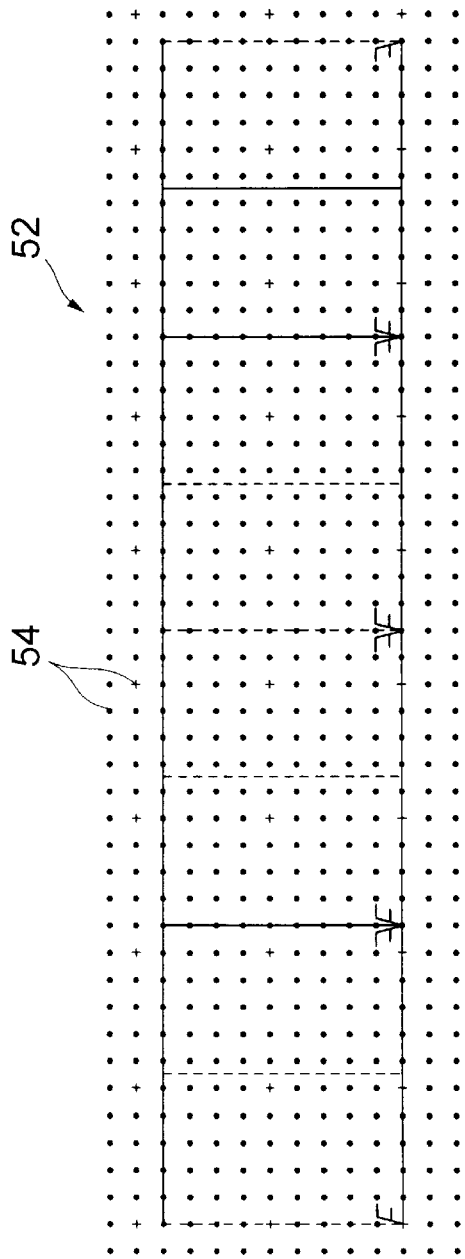
FIG. 7B is a schematic top plan view of a gate array plane.
Figure 8:
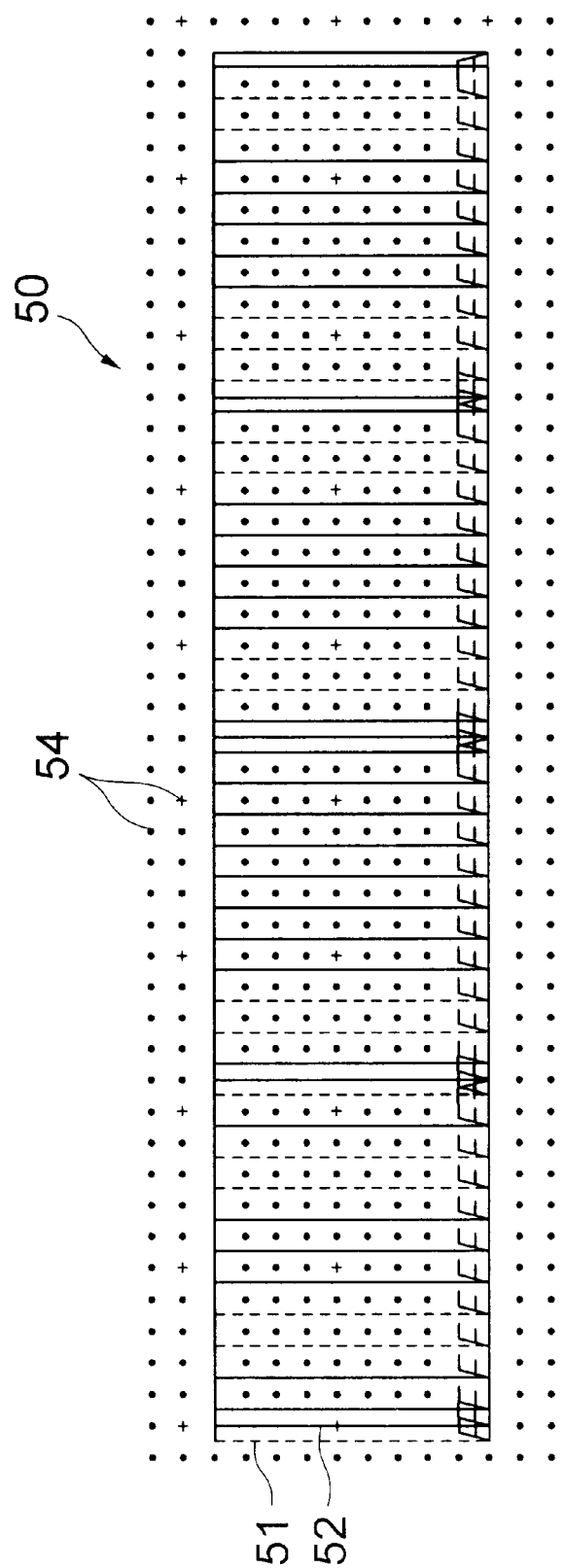
FIG. 8 is a schematic top plan view of an overlapping plane.

The site data storage section 15 stores data for a pair of imaginary planes including a cell base plane and a gate array plane as well as an overlapping plane for a single site of the chip for arranging the blocks thereon. FIGS. 7A and 7B show the cell base plane 51 and the gate array plane 52, respectively, whereas FIG. 8 shows the overlapping plane 50 obtained by overlapping the pair of planes 51 and 52. Numeral 54 in these figures denotes a grid used for specifying the location of an interconnect (or line) by specifying the coordinates of the grids.

The cell base plane 51 can receive thereon a plurality of cell base blocks 31 and a plurality of intermediate blocks 41, whereas the gate array plane 52 can receive thereon a plurality of gate array blocks 35 or a plurality of dummy gate blocks 42. The data for the overlapping plane 50 is obtained by adding the data for both the cell base plane 51 and the gate array plane 52.

The blocks 31, 35, 41, 42 have the same width (in the vertical direction as viewed in the figures) and respective lengths (in the lo horizontal direction as viewed in the figures) which are equal to integral multiples of the unit length, or products of the unit length by respective specific integers.

In the customized master slice finally obtained, the transistors in the gate array block 35 are connected together as desired, and the gate array blocks 35 and the cell base blocks 31 are interconnected by desired interconnections.

The path locations for the interconnections are defined by the coordinates of the grids in the respective planes. The grid pitch is equal to the unit length. Thus, the dimensions of the respective blocks are also defined by the integral multiple of the grid pitch.

As a specific example, the length of the intermediate block 41 is equal to the grid pitch, the lengths of the gate array block 35 and the dummy gate block 42 are equal to ten times the grid pitch, and the length of the cell base block 31 depends on the type of the cell base block.

The gate array block 35 and the dummy gate block 42 have limitations on the locations thereof when disposed on the gate array plane 52, as specified by the letter indicating normal "F" or reversed "F" in FIGS. 7A, 7B and 8. These letters normal "F" and reverse "F" correspond to the letters normal "F" and reverse "F" shown in FIGS. 4 and 6. Since the dummy gate block 42 has a configuration reversed from the configuration of the gate array block 35, as described before, the letters normal "F" and reversed "F" in the locations of FIG. 6 are reversed from those in the locations of FIG. 4.

As a result, the locations for the gate array block 35 and the dummy gate block 42 deviate from each other by a half of the block length as disposed on the gate array plane 52. On the other hand, the location or sense of the intermediate block 41 has no limitation on the base cell plane 51.

Although all the blocks 31, 35, 41 and 42 are shown as arranged in a single-dimensional array in the overlapping plane 50 in FIG. 8 for simplicity, these blocks are in fact arranged in a two-dimensional array, wherein elongated rows of the gates are arranged in the widthwise direction of the rows.

Back to FIG. 2, the design data input section 21 corresponds to the function of an input operation by an operator using the key-board or a read operation by the CPU 101 from the FDD 107, for example. The design data input section 21 receives design data and delivers the same to the CPU 101.

Figure 9A:
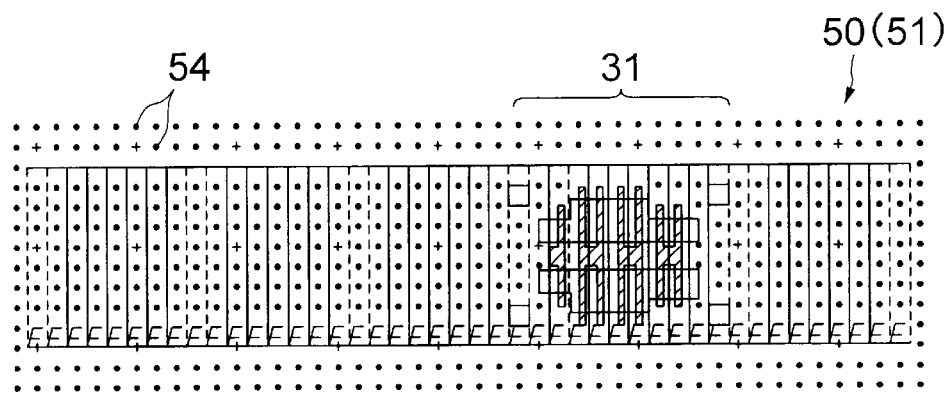
FIGS. 9A to 9F are schematic top plan views of the overlapping plane for consecutively showing the steps of the process conducted by the data processing system of FIG. 1.

The cell base block arrangement section 22 corresponds to the function of an execution of data processing by the CPU 101 based on the control program. The cell base block arrangement section 22 reads the site data including locational limitations on the cell base plane 51 and the gate array plane 52 from the site data storage section 15 and also the cell base block data from the cell base data storage section 11 based on the design data supplied from the design data input section 21. The cell base block arrangement section 22 then locates a specified cell base block 31 at a specified location on the cell base plane 51. The result of the location for the cell base block 31 is exemplified in FIG. 9A as viewed on the overlapping plane 50.

Figure 9B:
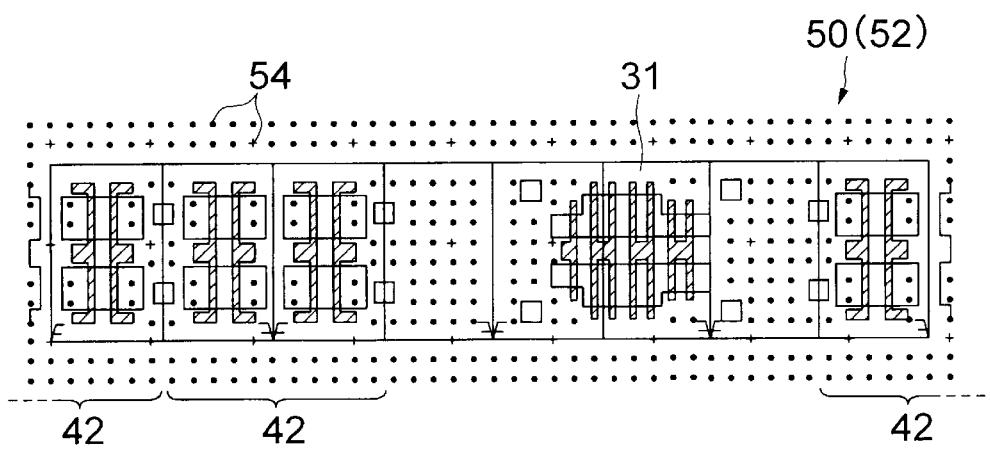

Other sections shown in FIG. 2 respectively correspond to the functions of the CPU 101. The dummy gate block arrangement section 23 reads data for the dummy gate block 42 from the dummy gate data storage section 14 and consecutively arranges the dummy gate blocks 42 on the gate array plane 52 at all locations other than the location where the cell base block 31 is disposed on the overlapping plane 50, as shown in FIG. 9B.

Since the dummy gate block 42 has a length ten times the unit length and the cell base block 31 has a length which is arbitrary integral multiple of the unit length, as described before, the space between the dummy gate block 42 and the cell base block 31 is equal to n times the unit length where $0 \leq n \leq 9$.

Figure 9C:
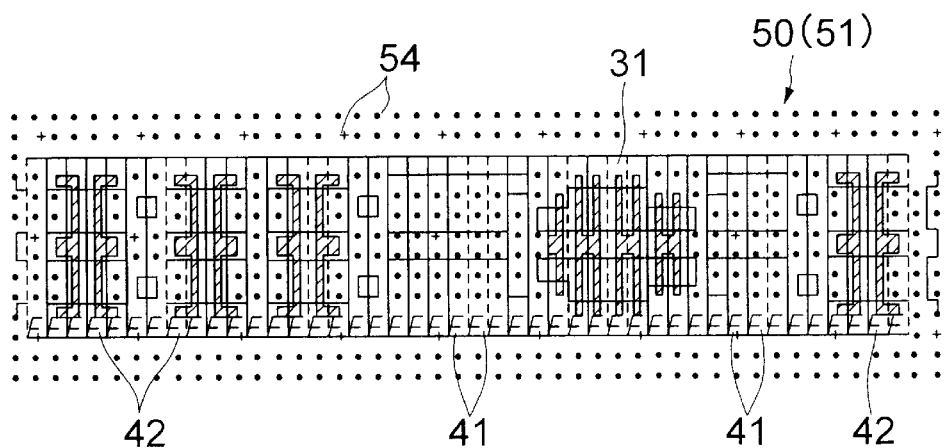

The intermediate block arrangement section 24 then reads data for the intermediate block 41 from the intermediate block data storage section 13, the intermediate block 41 having the unit length. The intermediate block arrangement section 24 consecutively arranges the intermediate blocks 41 on the cell base plane 51 at the spaces wherein the cell base block 31 and the dummy gate block 42 are not disposed on the overlapping plane 50, to thereby fill the spaces without any remaining space, as shown in FIG. 9C. In this step, each space receives therein one to nine intermediate blocks 41.

Figure 9D:
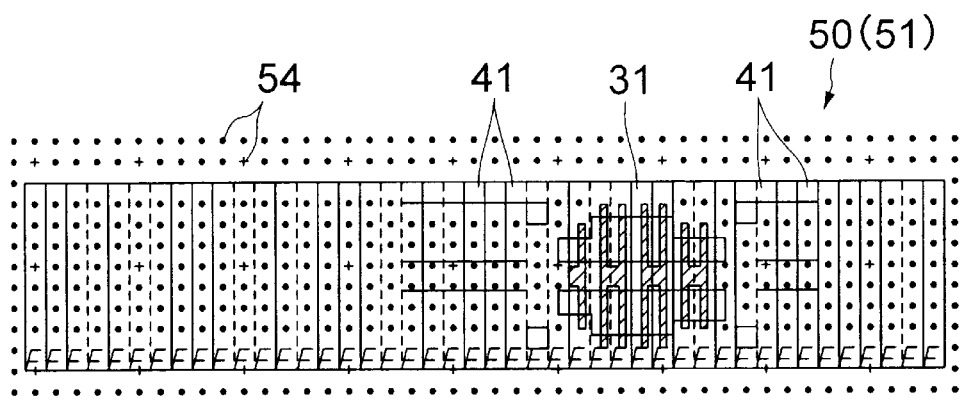
Figure 9E:
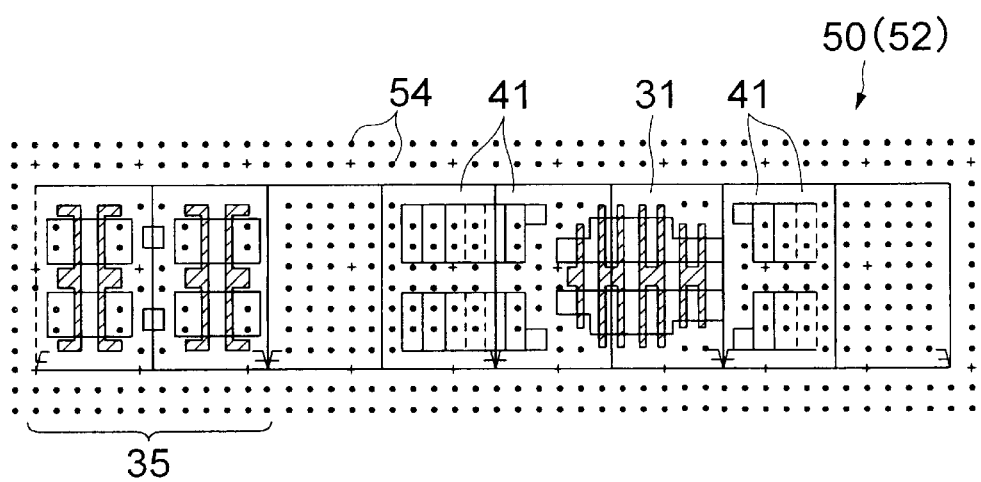

The dummy gate removing section 25 then removes the dummy gate blocks 42 from the gate array plane 52, as shown in FIG. 9D on the overlapping plane 50. Thereafter, the gate array block arrangement section 26 reads data for the gate array block 35 from the gate array data storage section 12, and arranges the gate array blocks 35 on the gate array plane 52 at the locations wherein the dummy gate blocks 42 are removed, as shown in FIG. 9E. In this arrangement, the accurate location of each of the gate array blocks 35 is shifted from the corresponding removed dummy block 42 by half the length of the gate array block 35, because the location of the gate array block 35 is subjected to the locational limitations as described before with reference to letters normal "F" and reverse "F".

Figure 9F:
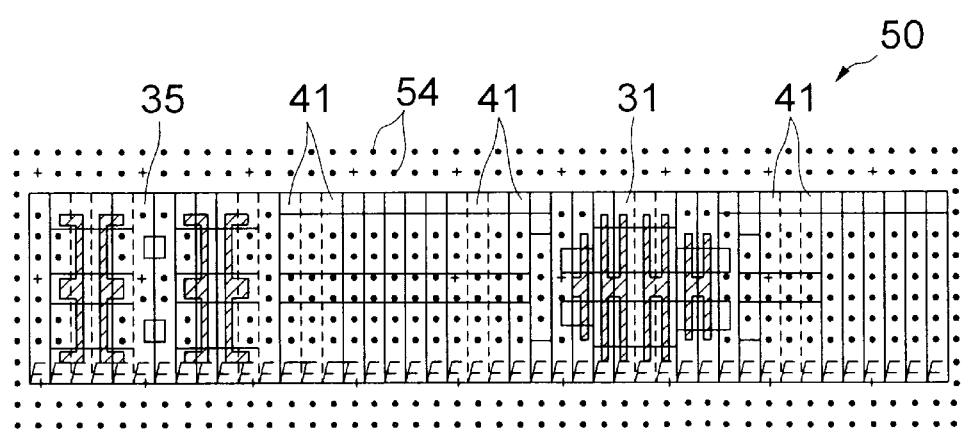

Due to the locational shift of the gate array block 35 with respect to the removed dummy gate block 42, a new space is generated at both sides of a row of the gate array block 35, as shown in FIG. 9E. The new space has a length which is five times the unit length, and is filled with other intermediate blocks 41 by the intermediate block arrangement section 27, to fill the new space without any remaining space, as shown in FIG. 9F.

Figure 10:
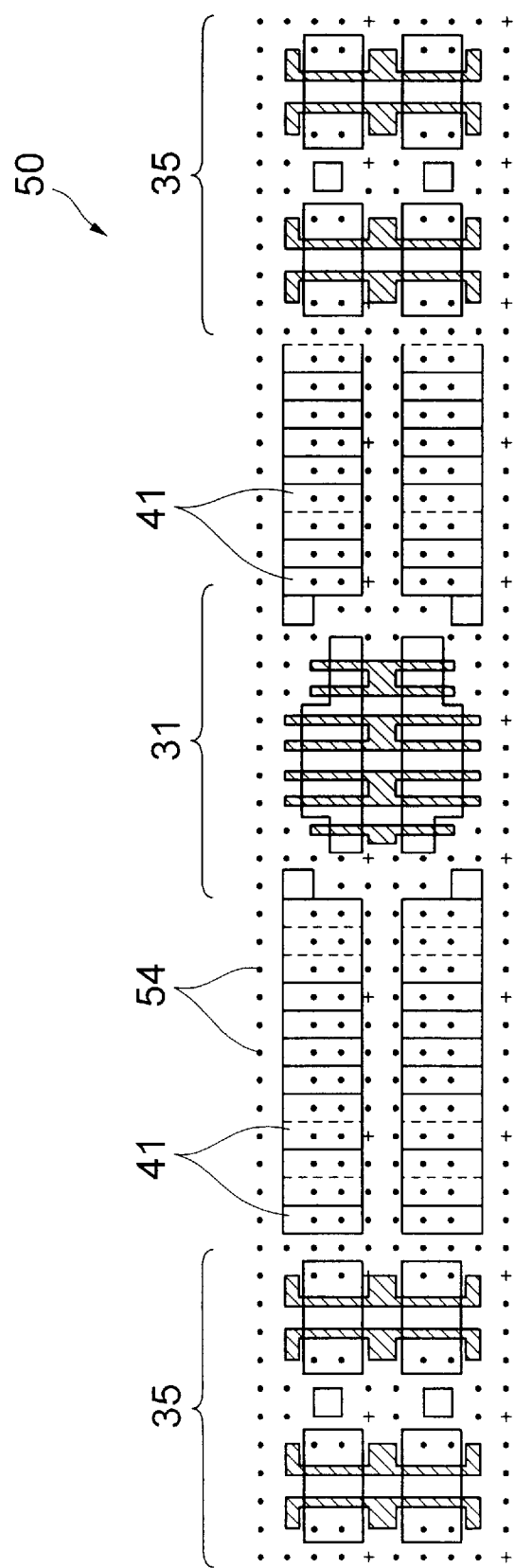
FIG. 10 is a schematic top plan view of a customized master slice specified by the data generated by the data processing system of FIG. 1.
Figure 11:
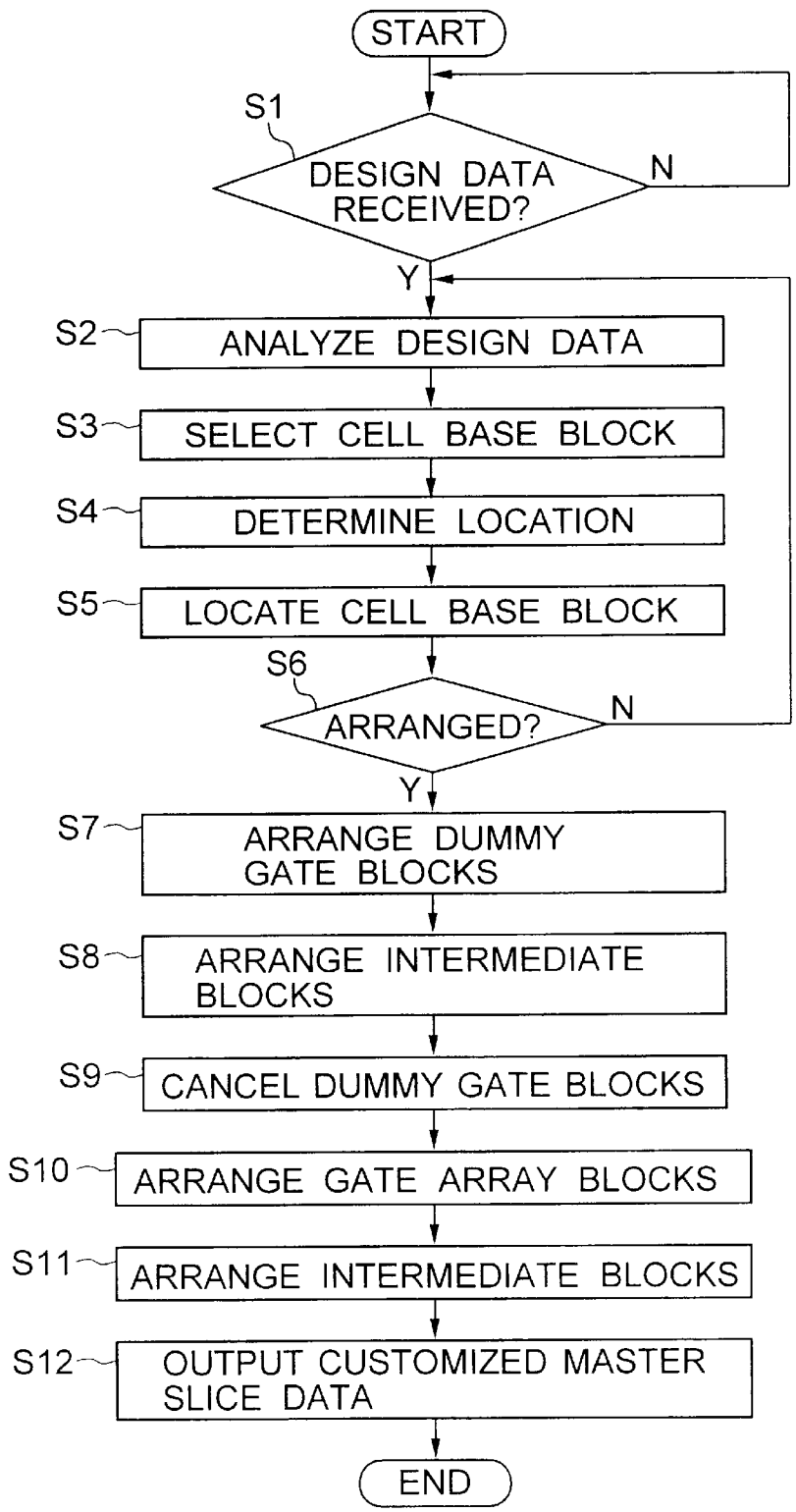
FIG. 11 is a flowchart of data processing according to an embodiment of the present invention.

The output section 28 corresponds to the function of a control operation by the CPU 101 controlling the display unit 112 or a read/write operation from/to the FDD 107, for example. The output section 28 outputs the final CAD data or customized master slice data, such as shown in FIG. 10, which is obtained on the overlapping plane 50 by overlapping the data on the cell base plane 51 and the data on the gate array plane 52.

The operations of the respective sections 21 to 28 are conducted by the CPU 101 running on the control program even without specific input operations on the key-board, although some input operations may be needed on the key-board for starting the data processing.

The control program stored in the CD-ROM 108 or HDD 105 may include a variety of program orders such as: forming a netlist by storing information of a plurality of types of cell base blocks 31, a gate array block 35, an intermediate block 41 and a dummy gate block 42; defining a cell base plane 51 and a gate array plane 52 and overlapping both the planes 51 and 52 to obtain an overlapping plane 50; receiving design data by responding to the input operations on the key-board 110; arranging a cell base block or blocks 31 on the cell base plane 51; arranging a plurality of dummy array blocks 35 on the gate array plane 52 in an area other than the area where the cell base block 31 is not disposed as viewed in the overlapping plane 50; arranging a plurality of intermediate blocks 41 on the cell base plane 51 in the space wherein the cell base block 31 and the dummy block 42 are not disposed as viewed in the overlapping plane 50; removing the dummy gate blocks 42 from the gate array plane 52; arranging gate array blocks 35 on the gate array plane 52 in the area where the dummy gate blocks 42 are removed, with a specific limitation to shift the location of each gate array block 35 from the corresponding removed dummy gate block 42; arranging intermediate blocks at the new space on the cell base plane 51 in the area wherein no blocks are disposed as viewed on the overlapping plane 50; combining the data on the gate array plane 52 and the data on the cell base plane 51 to obtain combined data on the overlapping plane 50 as a customized master slice data; and outputting the customized master slice data to the peripheral devices such as a display unit, printer or storage device.

In the data processing system according to the present embodiment, a variety of data are first prepared before operation of the data processing system for obtaining the customized master slice data. The variety of data include a netlist which contains data for a plurality of cell base blocks 31 each of a specific type, a gate array bock 35, intermediate block 41 and a dummy gate block 42, each of the blocks 31, 33, 41 and 42 having a specific length which is equal to an integral multiple of the unit length.

Referring to FIG. 10, a process used in the data processing system of the present embodiment includes step S1 to S12.

After it is confirmed in step S1 that the CPU 101 receives design data, the CPU analyzes the design data in step S2. The CPU 101 then selects one of the cell base blocks 31 in step S3, determines the location for the selected cell base block 31 in step S4, and locates the same at the location in step S5. After the selected cell base block 31 is located, the process returns to step S2 to repeat steps S2 to S6 for all the remaining selected cell base blocks 31 based on the design data. After it is confirmed in step S6 that all the cell base blocks 31 are arranged, the process advances to step S7, wherein dummy gate blocks 42 are arranged at the space where the cell base blocks 31 are not disposed.

The remaining spaces which have length equal to n times the unit length ($1 \leq n \leq 9$) are then filled with intermediate blocks 41 in step S8.

After the remaining spaces are filled with the intermediate blocks 41, the dummy gate blocks 42 are removed or cancelled in step S9, followed by arrangement of gate array blocks 35 in the spaces where the dummy gate blocks 42 are removed, in step S10. Intermediate blocks 41 are then disposed in the new spaces adjacent to any row of the gate array blocks 35 in step S11, the new space having a length equal to five times the unit length. After combining the gate array plane 52 and the cell base plane 51 to obtain a customized master slice data on the overlapping plane 50, the customized master slice data is output in step S12.

In the customized master slice data, since each row of the gate array block 35 is located adjacent to a cell base block 31, with a space therebetween being equal to or above half the length of the gate array block 35 and filled with the intermediate blocks 41, the interference between the cell base block 31 and the gate array block 35 can be effectively prevented at the boundary.

In addition, since the procedure for the arrangement does not include analysis of the internal structures of the cell base block 31 and the gate array block 35, the time length for the processing and the scale for the program can be reduced.

The specific configurations of the gate array block 35 and the dummy gate block 42 allow the simple shift operation of the gate array block 35 by a half block length to prevent the interference between the gate array block 35 and the cell base block 31.

In the above embodiment, the respective sections 21 to 28 are implemented by a CPU running on a specific program. However, at least a part of these sections 21 to 28 may be implemented by a hardware. The types of the storage sections 11 to 15 described in the embodiment may be changed depending on the scale for the control program.

The control program may be a combination of an operating system and an application software running on the operating system. The control program and/or the design data may be supplied by a communication network from outside the computer system.

Since the above embodiments are described only for examples, the present invention is not limited to the above embodiments and various modifications or alterations can be easily made therefrom by those skilled in the art without departing from the scope of the present invention.

What is claimed is:

1. A data processing system for designing a semiconductor device based on design data, comprising:

a block data storage section for storing first data specifying a gate array block, said gate array block including a plurality of transistors disposed in a line symmetry, second data specifying a plurality of cell base blocks, each of said cell base blocks including a plurality of transistors, third data specifying an intermediate block having a unit length and fourth data specifying a dummy gate block, said dummy gate block having a configuration obtained by reversing said gate array block around a line for said line symmetry, said gate array block and said dummy gate block having a length equal to an integral multiple of the unit length, said cell base block having an integral multiple of the unit length;

a first block arrangement section for consecutively locating at least one said cell base block in a first area based on the design data, a number of said dummy gate blocks in a second area, and a number of said intermediate blocks in an area other than said first and second areas;

a block removing section for removing the located dummy gate blocks after said first block arrangement section locates said intermediate blocks;

a second block arrangement section for locating a number of said gate array blocks in each space generated by removing said dummy gate blocks while shifting said gate array blocks by a specified amount from a corresponding one of the removed dummy gates;

a third block arrangement section for locating a number of said intermediate blocks in an area generated by shifting said gate array blocks; and an output section for outputting a customized master slice data based on the operation by said first through third block arrangement sections.

2. The data processing system as defined in claim 1, wherein the location of said cell blocks are conducted on first and second imaginary planes, and said customized master slice data is a combination of data on said first imaginary plane and data on said second imaginary plane.

3. The data processing system as defined in claim 1, wherein the unit length is equal to a grid pitch for locating interconnections.

4. The data processing system as defined in claim 1, wherein said gate array block includes a pair of CMOSFETs without interconnections therebetween.

5. The data processing system as defined in claim 1, wherein each of said cell base array forms at least one logic gate.

6. A method of data processing system for designing a semiconductor device based on design data, comprising the steps of:

storing first data specifying a gate array block, said gate array block including a plurality of transistors disposed in a line symmetry, second data specifying a plurality of cell base blocks, each of said cell base blocks including a plurality of transistors, third data specifying an intermediate block having a unit length and fourth data specifying a dummy gate block, said dummy gate block having a configuration obtained by reversing said gate array block around a line for said line symmetry, said gate array block and said dummy gate block having a length equal to an integral multiple of the unit length, said cell base block having an integral multiple of the unit length;

consecutively locating at least one said cell base block in a first area based on the design data, a number of said dummy gate blocks in a second area, and a number of said intermediate blocks in an area other than said first and second areas;

locating a number of said gate array blocks in each space generated by removing said dummy gate blocks while shifting said gate array blocks by a specified amount from a corresponding one of the removed dummy gates;

removing said dummy gate blocks after locating said intermediate blocks;

locating a number of said intermediate blocks in an area generated by shifting said gate array blocks; and outputting a customized master slice data based on the data obtained by the above steps.

7. The method as defined in claim 6, wherein the location of said blocks are conducted on first and second imaginary planes, and said customized master slice data is a combination of data on said first imaginary plane and data on said second imaginary plane.

8. The method as defined in claim 6, wherein the unit length is equal to a grid pitch for locating interconnections.

9. The method as defined in claim 8, wherein said gate array block includes a pair of CMOSFETs without interconnections therebetween.

10. The method as defined in claim 1, wherein each of said cell base array forms at least one logic gate.

11. A storage device storing a program specifying the process as defined in claim 6.

* * * * *